(12) United States Patent
Gotou et al.

(10) Patent No.: US 7,193,472 B2
(45) Date of Patent: Mar. 20, 2007

(54) POWER AMPLIFIER

(75) Inventors: Seiki Gotou, Tokyo (JP); Akira Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 223 days.

(21) Appl. No.: 11/066,765

(22) Filed: Feb. 28, 2005

(65) Prior Publication Data

US 2005/0231286 A1     Oct. 20, 2005

(30) Foreign Application Priority Data

Apr. 14, 2004   (JP)   ............... 2004-118658

(51) Int. Cl.
*H03F 3/68*   (2006.01)
(52) U.S. Cl. .................. 330/295; 330/124 R
(58) Field of Classification Search ............... 330/295, 330/124 R, 84, 126, 302
See application file for complete search history.

(56) References Cited

U.S. PATENT DOCUMENTS

| | | | |
|---|---|---|---|
| 5,420,541 A | 5/1995 | Upton et al. | |
| 5,568,086 A | 10/1996 | Schuss et al. | |
| 6,617,929 B2* | 9/2003 | Kim et al. ................. | 330/295 |
| 6,853,245 B2* | 2/2005 | Kim et al. ............... | 330/124 R |
| 6,861,907 B2* | 3/2005 | Gotou ........................ | 330/295 |

FOREIGN PATENT DOCUMENTS

WO     WO 97/20385     6/1997

OTHER PUBLICATIONS

Doherty, W.H.; "A New High Efficiency Power Amplifier for Modulated Waves", *Proc. IRE*, vol. 24, No. 9, pp. 1163-1182, (Sep. 1936).
Raab, F.H.; "Efficiency of Doherty RF Power-Amplifier Systems", *IEEE Trans. Broadcast*, vol. BC-33, No. 3, pp. 77-83, (Sep. 1987).
Iwamoto, M. et al.; "An Extended Doherty Amplifier With High Efficiency Over a Wide Power Range", *IEEE Trans. Microwave Theory Tech.*, vol. 49, No. 12, pp. 2472-2479, (Dec. 2001).
Yang, Y. et al.; "A Fully Matched N-Way Doherty Amplifier With Optimized Linearity", *IEEE Trans. Microwave Theory Tech.*, vol. 51, No. 3, pp. 986-993, (Mar. 2003).

* cited by examiner

*Primary Examiner*—Henry Choe
(74) *Attorney, Agent, or Firm*—Leydig, Voit & Mayer, Ltd.

(57) ABSTRACT

In a power amplifier a Doherty amplifier is provided with an output higher harmonic reflection circuit that is connected to the output terminal of a first FET chip and sets an even-numbered higher harmonic load of an output signal at the output terminal to be a short-circuit, or at a low impedance approximating a short-circuit, and sets an odd-numbered higher harmonic load of an output signal at the output terminal to be an open-circuit, or a high impedance approximating an open-circuit.

7 Claims, 9 Drawing Sheets

POWER AMPLIFIER

BACKGROUND OF THE INVENTION

1. Field of the Invention

The present invention relates to a high-frequency power amplifier and, more particularly to improvement of a Doherty high-frequency power amplifier used with microwave-band and millimeterwave-band communications equipment for mobile communication, satellite communication or the like.

2. Description of the Related Art

In recent years, there has been an increasing demand for smaller, higher-output communications equipment used in a microwave band and a millimeter wave band. In addition, there has been also an increasing demand for higher quality of propagated signals. With this trend, needs for high-frequency power amplifiers with less distortion have been increasing.

Especially a microwave communications system using multi-carrier signals or recent modulated-wave signals based on the CDMA method or the like actuates an amplifier at an output level that is far lower than its maximum power rating in order to avoid influences of distortion caused by nonlinearity of the amplifier that amplifies signals.

Regardless of high frequencies, typical amplifiers usually have high input signal levels and provide higher efficiency toward maximum output levels of the amplifiers. If, however, an input signal level is sufficiently lower than a maximum output level, that is, if offset backoff (hereinafter referred to as "OBO") is sufficiently large, then the efficiency is low accordingly. This has been making it difficult to achieve high efficiency.

The Doherty amplifier was first proposed by Doherty ("A New High Efficiency Power Amplifier For Modulated Waves", Proceedings of the Institute of Radio Engineers, Vol. 24, No. 9, September, 1936).

The Doherty amplifier is intended to be used with an AM broadcasting transmitter for low to medium frequencies, and has a carrier amplifier and a peak amplifier that are connected by an impedance conversion line having an electrical length equivalent to a quarter wavelength of a signal frequency. This configuration permits dramatically improved efficiency at a low output level.

A report by Raab on theoretical values of efficiency obtained by the Doherty amplifier indicates that high efficiency is maintained at output levels from an output point, which is a quarter of a maximum output, to a maximum output point, and that the output level at which a highly efficient operation is performed can be lowered to a quarter or less of the maximum output by setting outputs of a peak amplifier greater than those of the carrier amplifier ("Efficiency of Doherty RF power-amplifier systems", "IEEE Trans. Broadcast, vol. BC-33, pp. 77–83, September 1987).

There is a publicly known example wherein such Doherty amplifier is used in a microwave band. This has disclosed a Doherty amplifier equipped with a carrier amplifier that carries out higher harmonic load control and a peak amplifier that has a class B or class AB configuration as in the carrier amplifier and carries out higher harmonic load control (refer to, for example, paragraphs [0022] through [0024] and [0033] of Japanese Patent No. 2945833, and FIG. 4).

Another Doherty amplifier intended for achieving improved efficiency at a lower output level has been disclosed. This Doherty amplifier allows higher efficiency to be achieved from a low output level of one tenth or less of a maximum output, it can be achieved to triple an output of the carrier amplifier by making the size of a transistor used with its peak amplifier three times as large as the size of a transistor used with its carrier amplifier (refer to, for example, "An Extended Doherty Amplifier With High Efficiency Over a Wide Power Range" by M. Iwamoto et al., IEEE Trans. Microwave Theory Tech., Vol. 49, No. 12, pp. 2472–2479, December 2001).

Still another example of a Doherty amplifier intended for achieving improved efficiency at a lower output level has been disclosed. In this example, a plurality of peak amplifiers is used to provide an equivalent effect obtained by increasing the size of a transistor used with a peak amplifier (refer to, for example, "A Fully Matched N-Way Doherty Amplifier With Optimized Linearity" by Y. Yang et al., IEEE Trans. Microwave Theory Tech., Vol. 51, No. 3, pp. 986–993, March 2003).

A Doherty amplifier that adopts a parallel coupling configuration to improve linearity is disclosed in Published Japanese Translations of PCT International Publication for Patent Application No. H 10-513631.

Further, Japanese Patent Laid-open No. H 8-330873 has disclosed a configuration for linearly amplifying a noise-like RF signal having a multicarrier. The configuration includes a ¼ wavelength impedance transforming circuit that uses a load at an output end of a carrier amplifier as the normalized impedance of an optimal load impedance and a ½ wavelength phase shifter. In addition, an input end of a peak amplifier is disposed with a ¼ wavelength phase shifter, a ¼ wavelength impedance transforming circuit that uses a load at an output end of a peak amplifier as the normalized impedance of an optimal load impedance, and a ¼ wavelength phase shifter.

The Doherty amplifier disclosed in Japanese Patent No. 2945833 has a basic construction of a Doherty high-frequency power amplifier used with microwave-band or millimeterwave-band communications equipment. In response to a demand for an amplifier that restrains low distortion caused by an extended OBO and improves efficiency, the Doherty amplifier disclosed in M. Iwamoto et al. achieves higher efficiency by increasing the size of the transistor used with the peak amplifier. In this Doherty amplifier, however, a problem arises in that the carrier amplifier and the peak amplifier use transistors of significantly different sizes, so that its divider circuit and combiner circuit inevitably have complicated configurations.

Furthermore, a Doherty amplifier requires a Doherty network having an electrical length equivalent to a quarter wavelength of a signal frequency at an output end, and a phase compensating circuit at an input end, the phase compensating circuit having an electrical length equivalent to a quarter wavelength of a signal frequency for offsetting a phase difference between a carrier amplifier and a peak amplifier that occurs in the Doherty network. If operating frequencies are low, then these circuits inevitably become extremely large, resulting in an increased size of the whole amplifier. As a solution, therefore, the Doherty amplifier disclosed in Young et al. described above uses a plurality of phase compensating circuits and peak amplifiers to improve the efficiency at a lower output level. This, however, involves a complicated configuration. Furthermore, since a plurality of the phase compensating circuits and the peak amplifiers are provided, so that the phase compensating circuits take up even more area accordingly, making it difficult to accomplish a compact amplifier.

SUMMARY OF THE INVENTION

The present invention has been made with a view toward solving the aforementioned problems, and it is a first object to constitute a high-frequency power amplifier that allows high efficiency to be obtained at a low output level with a larger offset backoff from a maximum output. A second object of the present invention is to provide a smaller package type Doherty high-frequency power amplifier.

According to one aspect of the invention, there is provided a high-frequency power amplifier comprising: a divider circuit having an input end and a first branch and a second branch for dividing input signals received through the input end into first input signals and second input signals; a first amplifier circuit including a first transistor that has a first control terminal connected to the first branch of the divider circuit to receive the first input signal, a first constant-potential terminal, and a first output terminal through which a first output signal is issued, and a first output higher harmonic load control circuit connected to the first output terminal of the first transistor, setting an even higher harmonic load of a first output signal at the first output terminal to be short-circuited or at a low impedance approximate to a short circuit, while setting an odd higher harmonic load of the first output signal at the first output terminal to be open-circuited or at a high impedance approximate to an open circuit; a first impedance conversion circuit having one end thereof connected to an output end of the first output higher harmonic load control circuit of the first amplifier circuit, and having an electrical length equivalent to one quarter of the wavelength of a first output signal propagated through the intermediary of the output higher harmonic load control circuit; a second impedance conversion circuit having one end thereof connected to the second branch, and imparting a phase difference, which offsets a phase difference to be imparted by the first impedance conversion circuit, to a second input signal from the second branch; a second amplifier circuit including a second transistor that has a second control terminal connected to an output end of the second impedance conversion circuit to receive a second input signal, a second constant-potential terminal, and a second output terminal through which a second output signal is issued, and a second output higher harmonic load control circuit connected to the second output terminal of the second transistor, setting an even higher harmonic load of a second output signal at the second output terminal to be open-circuited or at a high impedance approximate to an open circuit, while setting an odd higher harmonic load of the second output signal at the second output terminal to be short-circuited or at a low impedance approximate to a short circuit; and a combiner circuit having a third branch, a fourth branch, and an output end through which a third output signal is issued, the third branch connected to an output end of the first impedance conversion circuit, the fourth branch connected to an output end of the second output higher harmonic load control circuit.

Accordingly, in the high-frequency power amplifier according to the present invention, the first amplifier circuit performs a class F operation, while the second amplifier circuit performs a class inverse-F operation, allowing the outputs of the second amplifier circuit to exceed the outputs of the first amplifier circuit.

This makes it possible to achieve improved efficiency of the amplifier in a low output level range provided with a back-off from a maximum output.

In other words, a high-frequency power amplifier according to the present invention enables the peak amplifier to provide outputs that are greater than those of the carrier amplifier, permitting higher output efficiency of the amplifier to be achieved in a low output level range with a sufficient offset backoff from a maximum output of the amplifier.

As a result, it is possible to provide a Doherty amplifier having a simple configuration that outputs signals of good quality with minimized distortion, the Doherty amplifier being used with microwave-band and millimeterwave-band communications equipment for mobile communication, satellite communication or the like.

According to another aspect of the invention, there is provided a high-frequency power amplifier comprising: a dielectric circuit board; a divider circuit disposed on the circuit board, having an input end and a first branch and a second branch for dividing input signals received through the input end into first input signals and second input signals; a package disposed on the circuit board, having a metal substrate and a wall which is disposed on the metal substrate, and which surrounds a predetermined region of the metal substrate, a plurality of connecting terminals which connects between an internal region surrounded by the wall and an external region, and a covering member which seals an area inside the wall; a first amplifier circuit disposed on the region of the metal substrate surrounded by the wall of the package, including a first transistor that has a first control terminal connected to the first branch of the divider circuit through the intermediary of a first one of the plural connecting terminals to receive the first input signal, a first constant-potential terminal, and a first output terminal through which a first output signal is issued, and a first output higher harmonic load control circuit that is connected to the first output terminal of the first transistor, setting an even higher harmonic load of a first output signal at the first output terminal to be short-circuited or at a low impedance approximate to a short circuit, while setting an odd higher harmonic load of the first output signal at the first output terminal to be open-circuited or at a high impedance approximate to an open circuit; a first impedance conversion circuit disposed on the circuit board, having one end thereof connected to an output end of the first output higher harmonic load control circuit through the intermediary of a second one of the plural connecting terminals, and having an electrical length equivalent to one quarter of the wavelength of a first output signal propagated through the intermediary of the output higher harmonic load control circuit; a second impedance conversion circuit disposed on the circuit board, having one end thereof connected to the second branch, and imparting a phase difference, which offsets a phase difference to be imparted by the first impedance conversion circuit, to a second input signal from the second branch; a second amplifier circuit disposed on the region of the metal substrate surrounded by the wall of the package, including a second transistor that has a second control terminal connected to an output end of the second impedance conversion circuit through the intermediary of a third one of the plural connecting terminals to receive a second input signal, a second constant-potential terminal, and a second output terminal through which a second output signal is issued, and a second output higher harmonic load control circuit connected to the second output terminal of the second transistor, setting an even higher harmonic load of a second output signal at the second output terminal to be open-circuited or at a high impedance approximate to an open circuit, while setting an odd higher harmonic load of the second output signal at the second output terminal to be short-circuited or a low impedance approximate to a short circuit; and a combiner circuit disposed on the circuit board, having a third branch, a fourth branch, and an output end through which a third output signal is issued, the third branch connected to an output end of the first impedance conversion circuit, the fourth branch connected to an output end of the second output higher harmonic load control circuit through a fourth one of the plural connecting terminals, and a third output signal is issued through the output end.

Accordingly, a high-frequency power amplifier according to the present invention enables to provide a smaller package type Doherty amplifier having a simple configuration that outputs signals of good quality with minimized distortion.

According to still another aspect of the invention, there is provided a high-frequency power amplifier comprising: a dielectric circuit board; a divider circuit disposed on the circuit board, having an input end and a first branch and a second branch for dividing input signals received through the input end into first input signals and second input signals; a package disposed on the circuit board, having a metal substrate and a wall which is disposed on the metal substrate, and which surrounds a predetermined region of the metal substrate, a plurality of connecting terminals which connects between an internal region surrounded by the wall and an external region, and a covering member for which seals the region inside the wall; a first amplifier circuit disposed on the region of the metal substrate surrounded by the wall of the package, including a first transistor that has a first control terminal connected to the first branch of the divider circuit through the intermediary of a first one of the plural connecting terminals to receive the first input signal, a first constant-potential terminal, and a first output terminal through which a first output signal is issued, and a first output higher harmonic load control circuit that is connected to the first output terminal of the first transistor, setting a higher harmonic load of a first output signal at the first output terminal to a predetermined value; a first impedance conversion circuit including a dielectric board having a specific inductive capacity that is larger than that of the circuit board, and a line disposed on the dielectric board, having an electrical length equivalent to a quarter of the wavelength of a first output signal propagated through the intermediary of the output higher harmonic load control circuit, the first impedance conversion circuit disposed on the region of the metal substrate surrounded by the wall of the package through the intermediary of the dielectric board, and one end of the first impedance conversion circuit connected to an output end of the first output higher harmonic load control circuit; a second impedance conversion circuit disposed on the circuit board, having one end thereof connected to the second branch, and imparting a phase difference, which offsets a phase difference to be imparted by the first impedance conversion circuit, to a second input signal from the second branch; a second amplifier circuit disposed on the region of the metal substrate surrounded by the wall of the package, including a second transistor that has a second control terminal connected to an output end of the second impedance conversion circuit through the intermediary of a second one of the plural connecting terminals to receive a second input signal, a second constant-potential terminal, and a second output terminal through which a second output signal is issued, and a second output higher harmonic load control circuit connected to the second output terminal of the second transistor, setting a higher harmonic load of a second output signal at the second output terminal to a predetermined value; and a combiner circuit disposed on the circuit board having a third branch, a fourth branch, and an output end through which a third output signal is issued, the third branch connected to an output end of the first impedance conversion circuit through the intermediary of a third one of the plural connecting terminals, the fourth branch connected to an output end of the second output higher harmonic load control circuit through the intermediary of a fourth one of the plural connecting terminals.

Accordingly, a high-frequency power amplifier according to the present invention enables to provide a compact Doherty amplifier by disposing a Doherty network in a package, the Doherty network being formed using a microstrip line of a quarter wavelength of a signal frequency and disposed on the board formed of a dielectric exhibiting a higher specific inductive capacity than that used for a circuit board. Moreover, it is possible to provide a compact Doherty high-frequency power amplifier having a simple configuration that outputs signals of good quality with minimized distortion.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

First Embodiment

Figure 1:
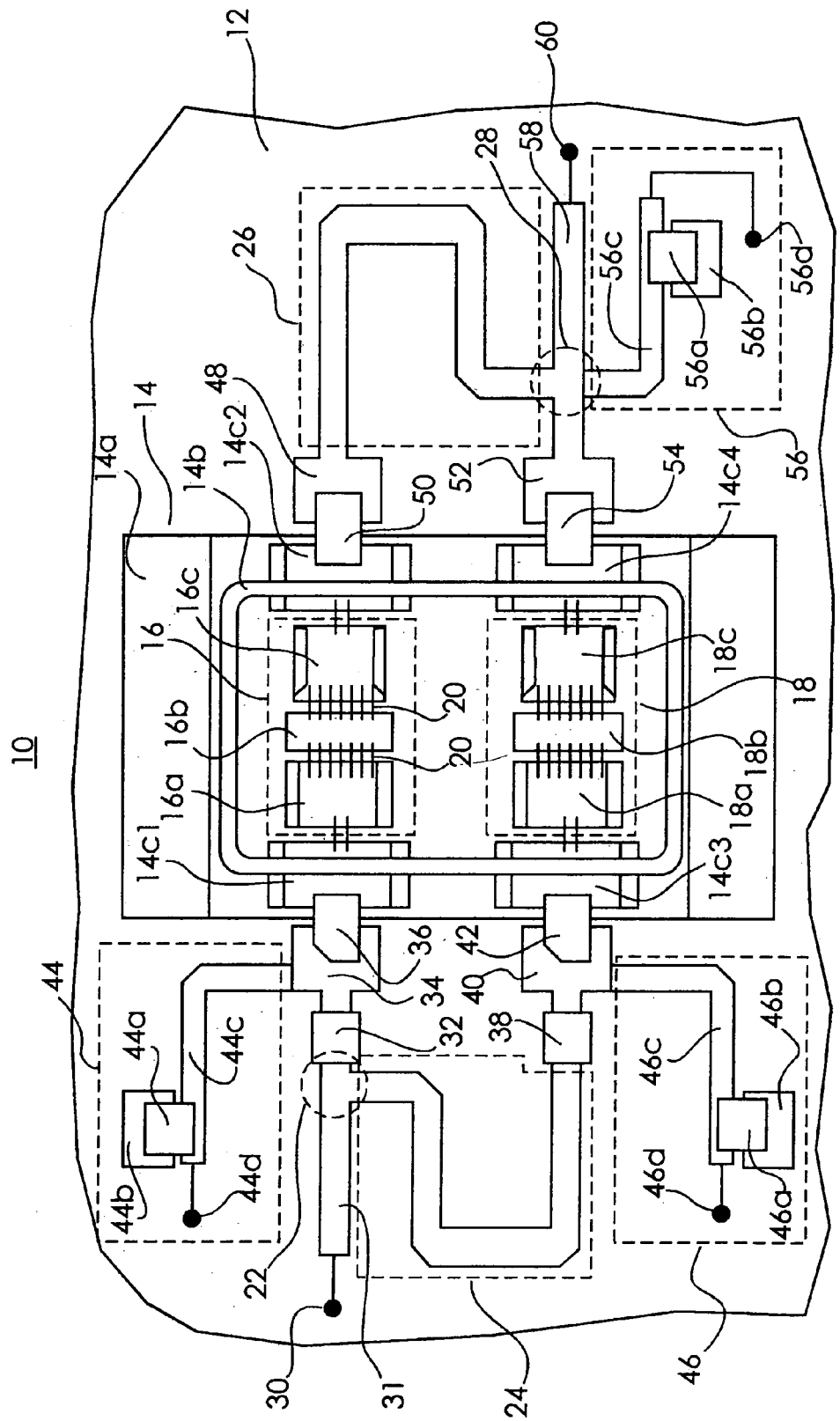
FIG. 1 is a plan view of a high-frequency power amplifier according to one embodiment of the present invention.

FIG. 1 is a plan view of a high-frequency power amplifier according to one embodiment of the present invention.

Referring to FIG. 1, a Doherty amplifier 10, which is an example of the first embodiment, uses a board 12 formed of, for example, a polytetrafluoroethylene member (hereinafter referred to as "PTFE") serving as a circuit board.

As a material for the circuit board, a dielectric having a specific inductive capacity of about 2 to about 5 is used. In addition to PTFE having a specific inductive capacity of about 2.6, glass epoxy or the like having a specific inductive capacity of about 4.4 may be used.

A metal package 14 formed of a copper-molybdenum laminated material or CuW is disposed on the PTFE board 12.

The package 14 includes a metal substrate 14a, a wall 14b that is formed on the metal substrate 14a to surround a central portion of the metal substrate, and four connecting terminals 14c (14c1, 14c2, 14c3, and 14c4) for connecting internal circuits surrounded by the wall 14b and external circuits. In addition, a covering member (not shown) for sealing the circuit parts and circuit patterns disposed in the area surrounded by the wall 14b is disposed on the top of the wall 14b.

A carrier amplifier 16 serving as a first amplifier circuit and a peak amplifier 18 serving as a second amplifier circuit that constitute the Doherty amplifier circuit are disposed on the area surrounded by the wall 14b of the package 14.

The carrier amplifier 16 is constructed of a first input matching circuit 16a, a first FET chip 16b serving as a first transistor, and a first output matching circuit 16c. The peak amplifier 18 is constructed of a second input matching circuit 18a, a second FET chip 18b serving as a second transistor, and a second output matching circuit 18c. The terminals of the components making up the carrier amplifier 16 and the peak amplifier 18 are connected by wires 20, as necessary. The wires 20 connect an input end of the first input matching circuit 16a with the connecting terminal 14c1, an output end of the first output matching circuit 16c with the connecting terminal 14c2, an input end of the second input matching circuit 18a with the connecting terminal 14c3, and an output end of the second output matching circuit 18c with the connecting terminal 14c4, respectively.

The components making up these carrier amplifier 16 and the peak amplifier 18 are disposed on the area of the metal substrate 14a surrounded by the wall 14b of the package 14 and they are sealed by the covering member.

On the PTFE board 12, a divider circuit 22 and a phase compensating circuit 24 serving as a second impedance conversion circuit, which constitute the Doherty amplifier circuit, are disposed at the input end adjacently to the package 14. Further, a Doherty network 26 serving as a first impedance conversion circuit and a combiner circuit 28 are disposed at the output end.

The divider circuit 22 has an input end 22a connected to a signal input terminal 30 and a first branch 22b connected to a connection land 34 through the intermediary of a chip capacitor 32. The connection land 34 is connected to the connecting terminal 14c1 by a connecting wire 36. A second branch 22c of the divider circuit 22 is connected to the phase compensating circuit 24, and the phase compensating circuit 24 is connected to a connection land 40 through the intermediary of a chip capacitor 38. The connection land 40 is joined to the connecting terminal 14c3 by a connecting wire 42.

The phase compensating circuit 24 offsets a phase difference between the carrier amplifier 16 and the peak amplifier 18 caused by the Doherty network 26, and it is composed of, for example, a microstrip line having an electrical length equivalent to a quarter wavelength of a signal frequency.

Hence, an input signal received through the signal input terminal 30 is passed through a microstrip line 31 and divided into two signals by the divider circuit 22. One signal is transmitted from the first branch 22b of the divider circuit 22 to the first input matching circuit 16a through the connecting terminal 14c1, while the other signal is transmitted from the second branch 22c of the divider circuit 22 to the second matching circuit 18a through the connecting terminal 14c3.

A first gate bias circuit 44 is formed of a line 44c having one end thereof connected to an earth end 44b through the intermediary of a chip capacitor 44a and the other end thereof connected to a connection land 34. A gate bias voltage Vgg1 is applied to a signal input terminal 44d connected to the line 44c. The gate bias voltage Vgg1 is applied to the gate of the first FET chip 16b of the carrier amplifier 16 through the intermediary of the connecting terminal 14c1 and the first input matching circuit 16a.

A second gate bias circuit 46 is formed of a line 46c having one end thereof connected to an earth end 46b through the intermediary of a chip capacitor 46a and the other end thereof connected to a connection land 40. A gate bias voltage Vgg2 is applied to a signal input terminal 46d connected to the line 46c. The gate bias voltage Vgg2 is applied to the gate of the second FET chip 18b of the peak amplifier 18 through the intermediary of the connecting terminal 14c3 and the second input matching circuit 18a.

In the Doherty amplifier 10 according to the first embodiment, the gate bias voltage Vgg1 of the first FET chip 16b of the carrier amplifier 16 and the gate bias voltage Vgg2 of the second FET chip 18b of the peak amplifier 18 use different voltages. For this reason, the chip capacitor 32 and the chip capacitor 38 are both DC-cut capacitors.

The Doherty network 26 is composed of, for example, a microstrip line having an electrical length equivalent to a quarter wavelength of a signal frequency. One end of the Doherty network 26 is attached to the connection land 48 and connected to the connected terminal 14c3 of the package 14 through the intermediary of a connecting wire 50. The other end of the Doherty network 26 is connected to the first branch 28a of the combiner circuit 28 serving as a third branch of the combiner circuit.

A second branch 28b of the combiner circuit 28 serving as a fourth branch of the combiner circuit is attached to a connection land 52 and connected to the connecting terminal 14c4 of the package 14 through the intermediary of a connecting wire 54.

A drain bias circuit 56 has one end thereof connected to an earth end 56b through the intermediary of a chip capacitor 56a and the other end thereof composed of a line 56c connected to the combiner circuit 28. A drain bias voltage Vdd is applied to a signal input terminal 56d connected to the line 56c. The drain bias voltage Vdd is applied to the drain of the first FET chip 16b through the intermediary of the Doherty network 26, the connecting terminal 14c2 and the first output matching circuit 16c, and to the drain of the second FET chip 18b through the intermediary of the connecting terminal 14c4 and the second output matching circuit 18c. In this example, the single drain bias circuit 56 supplies the drain bias voltage Vdd for the first FET chip 16b and the second FET chip 18b. Alternatively, however, a separate drain bias circuit may be provided for each of the FET chips.

Thus, the first output signal amplified by the carrier amplifier 16 is transmitted to the combiner circuit 28 through the intermediary of the connecting terminal 14c3 and the Doherty network 26, while the second output signal amplified by the peak amplifier 18 is transmitted to the combiner circuit 28 through the intermediary of the connecting terminal 14c4. The first and second output signals are combined by the combiner circuit 28 and applied to an output load RL from an output terminal 60 via an output end 28c of the combiner circuit 28 and a transmission line 58.

Figure 2:
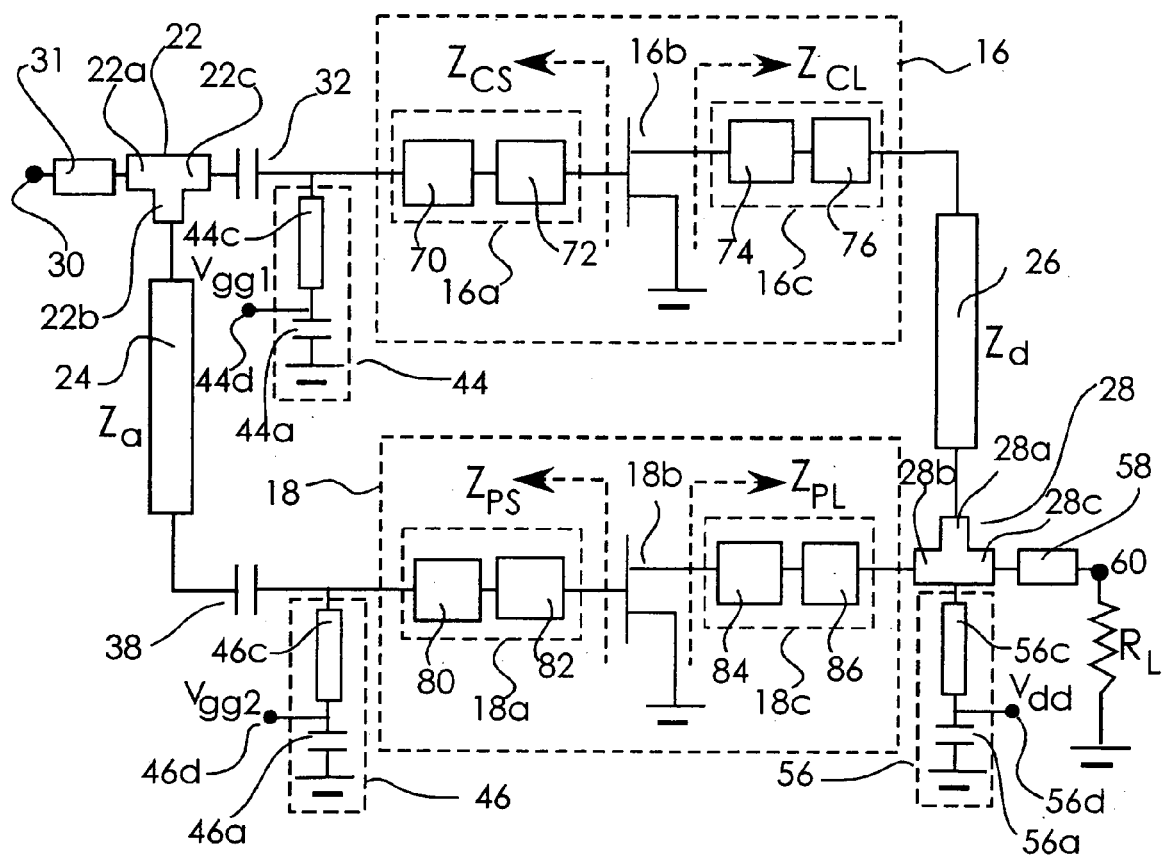
FIG. 2 is a circuit diagram of the high-frequency power amplifier according to the embodiment of the present invention.

FIG. 2 is a circuit diagram of the high-frequency power amplifier according to the embodiment of the present invention. In all figures, the same reference numerals denote the same or equivalent components.

Referring to FIG. 2, the first input matching circuit 16a of the carrier amplifier 16 is constructed of an input fundamental wave matching circuit 70 primarily disposed at the input end of signals and a first input higher harmonic reflection circuit 72 serving as a first input higher harmonic load control circuit secondary disposed adjacently to the first FET chip 16b. The first output matching circuit 16c of the carrier amplifier 16 is constructed of a first output higher harmonic reflection circuit 74 serving as a first output higher harmonic load control circuit primarily disposed adjacently to the first FET chip 16b and a fundamental wave load adjusting circuit 76 secondary disposed adjacently to the output end of signals.

Further, a second input matching circuit 18a of the peak amplifier 18 is constructed of an input fundamental wave matching circuit 80 primarily disposed at the input end of signals and a second input higher harmonic reflection circuit 82 serving as a second input higher harmonic load control circuit secondary disposed adjacently to the second FET chip 18b. The second output matching circuit 18c of the peak amplifier 18 is constructed of a second output higher harmonic reflection circuit 84 serving as a second output higher harmonic load control circuit primarily disposed adjacently to the second FET chip 18b and a fundamental wave load adjusting circuit 86 secondary disposed adjacently to the output end of signals.

A first input signal from the first branch 22b of the divider circuit 22 is supplied to the gate terminal serving as the first control terminal of the first FET chip 16b through the intermediary of the first input matching circuit 16a composed of the input fundamental wave matching circuit 70 and the first input higher harmonic reflection circuit 72 disposed adjacently to the input end in this order. A source terminal of the first FET chip 16b is grounded, the source terminal serving as a first constant-voltage terminal. A first output signal is issued from the drain terminal, serving as the first output terminal, of the first FET chip 16b, and transmitted to the Doherty network 26.

Further, a second input signal from the second branch 22c of the divider circuit 22 is supplied via the phase compensating circuit 24 to the gate terminal, serving as the second control terminal, of the second FET chip 18b through the intermediary of the second input matching circuit 18a composed of the input fundamental wave matching circuit 80 and the second input higher harmonic reflection circuit 82. A source terminal, serving as a second constant-voltage terminal, of the second FET chip 18b is grounded. A second output signal is issued from the drain terminal, serving as the second output terminal, of the second FET chip 18b, and transmitted to the combiner circuit 28. In the combiner circuit, the first output signal and the second output signal are combined and the resulting signal is applied as a third output signal to the output load RL.

In the Doherty amplifier 10 shown in FIG. 1 and FIG. 2, the load of an input signal at the gate terminal of the first FET chip 16b of the carrier amplifier 16, i.e., the load at a higher harmonic frequency of an input signal at the input end of the first FET chip 16b is denoted by $Z_{CS}$, the load of an input signal at the drain terminal of the first FET chip 16b of the carrier amplifier 16, i.e., the load at a higher harmonic frequency of an output signal at the output end of the first FET chip 16b is denoted by $Z_{CL}$, the load of an input signal at the gate terminal of the second FET chip 18b of the peak amplifier 18, i.e., the load at a higher harmonic frequency of an input signal at the input end of the second FET chip 18b is denoted by $Z_{PS}$, and the load of an input signal at the drain terminal of the second FET chip 18b of the peak amplifier 18, i.e., the load at a higher harmonic frequency of an output signal at the output end of the second FET chip 18b is denoted by $Z_{PL}$. The loads are set as shown below when "$_{\_f0}$" is added to the load on a fundamental wave, "$_{\_2f0}$" is added to the load on a second harmonic, and "$_{\_3f0}$" is added to the load on a third harmonic.

$$Z_{CS\_f0} = Z_{cin} \quad (1)$$

$$Z_{CS\_2f0} \approx 0 \quad (2)$$

$$Z_{CS\_3f0} \approx \infty \quad (3)$$

$$Z_{CL\_f0} = Z_{cout} \quad (4)$$

$$Z_{CL\_2f0} \approx 0 \quad (5)$$

$$Z_{CL\_3f0} \approx \infty \quad (6)$$

$$Z_{PS\_f0} = Z_{pin} \quad (7)$$

$$Z_{PS\_2f0} \approx \infty \quad (8)$$

$$Z_{PS\_3f0} \approx 0 \quad (9)$$

$$Z_{PL\_f0} = Z_{pout} \quad (10)$$

$$Z_{PL\_2f0} \approx \infty \quad (11)$$

$$Z_{PL\_3f0} \approx 0 \quad (12)$$

where $Z_{cin}$ and $Z_{cout}$ denote optimal matching loads in the fundamental waves of signals in the first FET chip 16*b*, and $Z_{pin}$ and $Z_{pout}$ denote optimal matching loads in the fundamental waves of signals in the second FET chip 18*b*.

When the loads are set as indicated in (1) through (12) above, the carrier amplifier 16 will perform the class F operation and the peak amplifier 18 will perform the class inverse-F operation. Therefore, if the gate widths of the first FET chip 16*b* and the second FET chip 18*b* are the same, then the outputs of the second FET chip 18*b* will be larger than the outputs of the first FET chip 16*b*.

Thus, the outputs of the peak amplifier 18 will be larger than the outputs of the carrier amplifier 16 simply by setting the higher harmonic loads of the peak amplifier 18 to be different from the higher harmonic loads of the carrier amplifier 16. The efficiency of the amplifier can be enhanced in a low level output range with an increased offset backoff.

To generalize the settings of (1) through (12) shown above, for a load at the input end of the first FET chip 16*b* in the carrier amplifier 16, a load of the fundamental wave of an input signal is set as an optimal load, while an even higher harmonic load of an input signal is set to be short-circuited or a low impedance approximate to a short-circuit. For a load at the output end of the first FET chip 16*b* in the carrier amplifier 16, a load of the fundamental wave of an output is set as an optimal load, an even higher harmonic load is set to be short-circuited or a low impedance approximate to a short-circuit, and an odd higher harmonic load of an output signal is set to be open-circuit or at a high impedance approximate to open-circuit.

Similarly, for a load at the input end of the second FET chip 18*b* in the peak amplifier 18, a load of the fundamental wave of an input signal is set as an optimal load, while an even higher harmonic load of an input signal is set to be open-circuited or at a high impedance approximate to an open circuit. For a load at the output end of the second FET chip 18*b* in the peak amplifier 18, an even higher harmonic load of an output signal is set to be open-circuit or at a high impedance approximate to open-circuit, and an odd higher harmonic load of an output signal is set to be short-circuited or at a low impedance approximate to a short-circuit.

The load settings indicated in (1) through (12) above cover up to the third harmonics; however, theoretical values obtained by generalizing the load settings as shown above to consider higher harmonics of infinite orders indicate that the peak amplifier provides outputs that are ($\pi/2$) times as large as those of the carrier amplifier.

Figure 3:
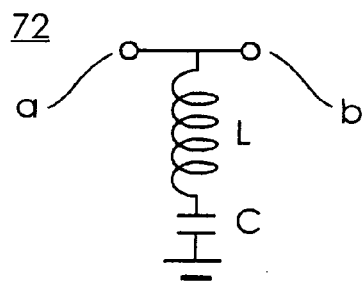
FIG. 3 is a circuit diagram showing an example of an input higher harmonic reflection circuit of the carrier amplifier according to the first embodiment.
Figure 4:
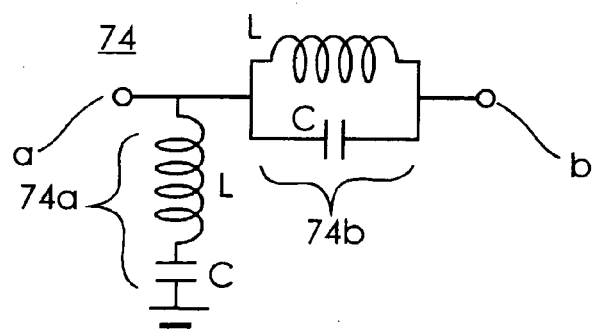
FIG. 4 is a circuit diagram showing an example of an output higher harmonic reflection circuit of the carrier amplifier according to the first embodiment.
Figure 5:
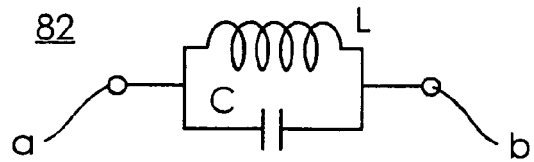
FIG. 5 is a circuit diagram showing an example of an input higher harmonic reflection circuit of the peak amplifier according to the first embodiment.
Figure 6:
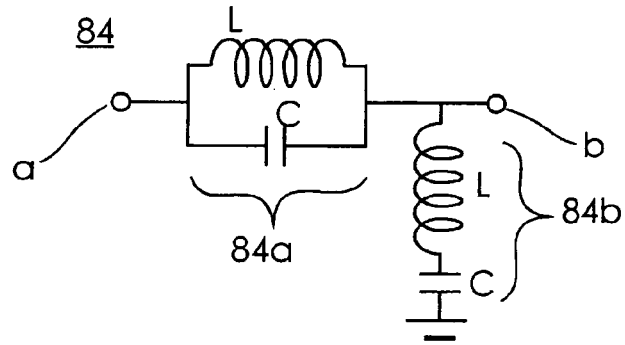
FIG. 6 is a circuit diagram showing an example of an output higher harmonic reflection circuit of the peak amplifier according to the first embodiment.

FIG. 3 is a circuit diagram showing an example of an input higher harmonic reflection circuit of the carrier amplifier according to the first embodiment. FIG. 4 is a circuit diagram showing an example of an output higher harmonic reflection circuit of the carrier amplifier according to the first embodiment. FIG. 5 is a circuit diagram showing an example of an input higher harmonic reflection circuit of the peak amplifier according to the first embodiment. FIG. 6 is a circuit diagram showing an example of an output higher harmonic reflection circuit of the peak amplifier according to the first embodiment.

In other words, the circuits shown in FIG. 3 through FIG. 6 are examples for implementing the load settings of (1) through (12).

A first input higher harmonic reflection circuit 72 shown in FIG. 3 is an LC series resonance circuit having one end thereof connected to an earth end, constituting a second higher harmonic reflection circuit. A terminal a of the circuit is connected to an input fundamental wave matching circuit 70, while a terminal b is connected to the gate of a first FET chip 16*b*, providing a short-circuited load relative to a second harmonic of an input signal.

A first output higher harmonic reflection circuit 74 shown in FIG. 4 is composed of an LC series resonance circuit 74*a* having one end thereof connected to an earth end and an LC parallel resonance circuit 74*b*. A terminal a providing a connection point of the LC series resonance circuit 74*a* and the LC parallel resonance circuit 74*b* is connected to the drain of a first FET chip 16*b*. In the first output higher harmonic reflection circuit 74, the LC series resonance circuit 74*a* constitutes a second higher harmonic reflection circuit and provides a short-circuited load relative to the second higher harmonic of an output signal, while the LC parallel resonance circuit 74*b* constitutes a third higher harmonic reflection circuit and provides an open-circuited load relative to a third harmonic.

A second input higher harmonic reflection circuit 82 shown in FIG. 5 is an LC parallel resonance circuit constituting a second harmonic reflection circuit and its terminal b is connected to the gate of a second FET chip 18*b*, providing an open-circuited load relative to a second harmonic of an input signal.

A second output higher harmonic reflection circuit 84 shown in FIG. 6 is composed of an LC series resonance circuit 84*a* having one end thereof connected to an earth end and an LC parallel resonance circuit 84*b*. A terminal a is connected to the drain of a second FET chip 18*b*, and a terminal b providing a connection point of the LC series resonance circuit 84*a* and the LC parallel resonance circuit 84*b* is connected to the drain of a fundamental wave load adjusting circuit 86. In the second output higher harmonic reflection circuit 84, the LC series resonance circuit 84*a* constitutes a third harmonic reflection circuit and provides a short-circuited load relative to the third harmonic of an output signal, while the LC parallel resonance circuit 84*b* constitutes a second harmonic reflection circuit and provides an open-circuited load relative to a second harmonic.

FIG. 7 through FIG. 10 show circuits disposed as more examples for implementing the load settings of (1) through (12).

Figure 7:
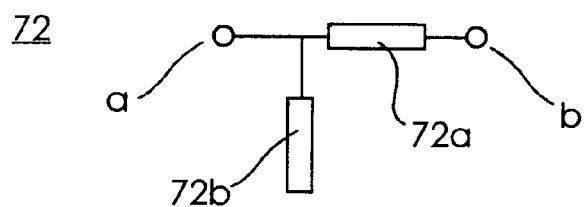
FIG. 7 is a circuit diagram showing an example of an input higher harmonic reflection circuit of the carrier amplifier according to the first embodiment.
Figure 8:
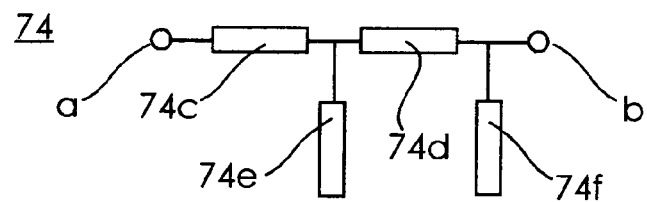
FIG. 8 is a circuit diagram showing an example of an output higher harmonic reflection circuit of the carrier amplifier according to the first embodiment.
Figure 9:
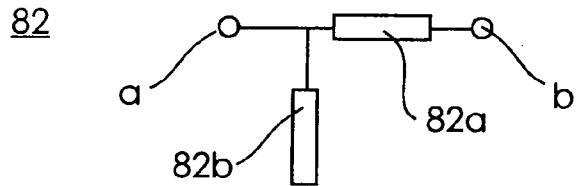
FIG. 9 is a circuit diagram showing an example of an input higher harmonic reflection circuit of the peak amplifier according to the first embodiment.
Figure 10:
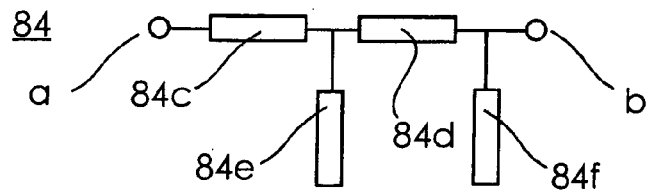
FIG. 10 is a circuit diagram showing an example of an output higher harmonic reflection circuit of the peak amplifier according to the first embodiment.

FIG. 7 is a circuit diagram showing an example of an input higher harmonic reflection circuit of the carrier amplifier according to the first embodiment. FIG. 8 is a circuit diagram showing an example of an output higher harmonic reflection circuit of the carrier amplifier according to the first embodiment. FIG. 9 is a circuit diagram showing an example of an input higher harmonic reflection circuit of the peak amplifier according to the first embodiment. FIG. 10 is a circuit diagram showing an example of an output higher harmonic reflection circuit of the peak amplifier according to the first embodiment.

A first input higher harmonic reflection circuit 72 shown in FIG. 7 is composed of a microstrip line 72*a* that is connected to an input fundamental wave matching circuit 70 through its terminal a and also connected to the gate of a first FET chip 16*b* through its terminal b, and has a predetermined length, and a microstrip line 72*b* that is shunt-connected with the microstrip line 72*a* at the terminal a and has an electrical length of one eighth wavelength of a signal frequency. In the first input higher harmonic reflection circuit 72, the microstrip line 72b is used as a second higher harmonic reflection stub, and the shape and length of the microstrip line 72a are properly set to make phase adjustment.

A first output higher harmonic reflection circuit 74 shown in FIG. 8 is composed of a microstrip line 74c and a microstrip line 74d connected in order in series between a terminal a and a terminal b, a microstrip line stub 74e that is shunt-connected between the microstrip line 74c and the microstrip line 74d and has an electrical length of one eighth wavelength of a signal frequency, and a microstrip line stub 74f shunt-connected between the microstrip line 74d and the terminal b and has an electrical length of one twelfth wavelength of a signal frequency. The terminal a is connected to the drain terminal of a first FET chip 16b, while the terminal b is connected to a fundamental wave load adjusting circuit 76. The stub 74e is a second harmonic reflection stub, and the stub 74f is a third harmonic reflection stub. The shapes and lengths of the microstrip line 74c and the microstrip line 74d are appropriately set to perform phase adjustment.

A second input higher harmonic reflection circuit 82 shown in FIG. 9 is composed of a microstrip line 82a that is connected to an input fundamental wave matching circuit 80 through its terminal a and also connected to the gate of a second FET chip 18b through its terminal b, and has a predetermined length, and a microstrip line 82b that is shunt-connected with the microstrip line 82a at the terminal a and has an electrical length of one eighth wavelength of a signal frequency. In the second input higher harmonic reflection circuit 82, the microstrip line 82b is used as a second harmonic reflection stub, and the shape and length of the microstrip line 82a are appropriately set to make phase adjustment.

A second output higher harmonic reflection circuit 84 shown in FIG. 10 is composed of a microstrip line 84c and a microstrip line 84d connected in order in series between a terminal a and a terminal b, a microstrip line stub 84e that is shunt-connected between the microstrip line 84c and the microstrip line 84d and has an electrical length of one eighth wavelength of a signal frequency, and a microstrip line stub 84f shunt-connected between the microstrip line 84d and the terminal b and has an electrical length of one twelfth wavelength of a signal frequency. The terminal a is connected to the drain terminal of a second FET chip 18b, while the terminal b is connected to a fundamental wave load adjusting circuit 86. The stub 84e is a second harmonic reflection stub, and the stub 84f is a third harmonic reflection stub. The shapes and lengths of the microstrip line 84c and the microstrip line 84d are appropriately set to perform phase adjustment.

Figure 11:
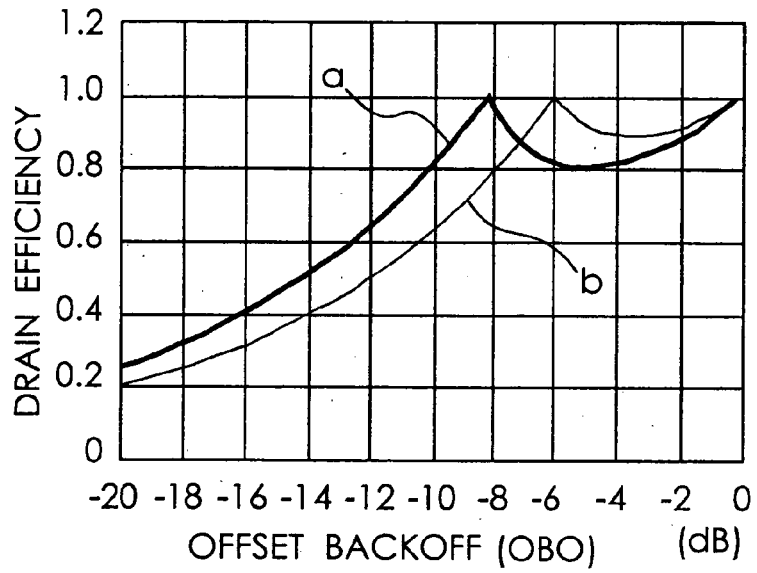
FIG. 11 is a graph showing calculated values of output efficiency in relation to offset backoff of a high-frequency power amplifier according to the first embodiment.

FIG. 11 is a graph showing calculated values of output efficiency in relation to offset backoff of a high-frequency power amplifier according to the first embodiment.

Referring to FIG. 11, a curve a indicates the efficiency of a Doherty amplifier according to the present invention. A curve b indicates actually measured values of the efficiency of a conventional Doherty amplifier shown for the purpose of comparison. In the curve b, the conditions of the load at an input end and the load at an output end are set to be the same for both a carrier amplifier and a peak amplifier.

As shown in FIG. 11, the Doherty amplifier 10 according to the first embodiment exhibits improved output efficiency in a low output level range with a large offset backoff from a maximum output.

In the Doherty amplifier 10, the carrier amplifier 16 performs the class F operation, while the peak amplifier 18 performs the class inverse-F operation. Setting the characteristic impedance of the Doherty network 26 at an optimal value contributes to improved efficiency at a low output level.

A characteristic impedance $Z_d$ of the Doherty network 26 is represented by the following expression:

$$Z_d = (T \times R_0)/\alpha \qquad (13)$$

where T indicates the ratio of a fundamental wave input voltage V1 at the input end of the Doherty network 26 to a fundamental wave output voltage V2 at the output end of the Doherty network 26, which is represented by T=V1/V2;

α indicates a fundamental wave output current at the output end of the Doherty network 26 when the fundamental wave output power of the entire amplifier 10 at a maximum output is set to 1, so that the fundamental wave output current at the output end of the peak amplifier 18 will be 1-α; and $R_0$ indicates an output load of the Doherty amplifier 10.

Since the carrier amplifier 16 performs the class F operation, and the peak amplifier 18 performs the class inverse-F operation, the following equations apply:

$$T = 8/(\pi^2) \qquad (14)$$

$$\alpha = 2/(2+\pi) \qquad (15)$$

Therefore, an optimal characteristic impedance $Z_{dopt}$ of the Doherty network 26 is:

$$Z_{dopt} = 4(2+\pi) \times R_0/(\pi^2) \qquad (16)$$

First Modification

Figure 12:
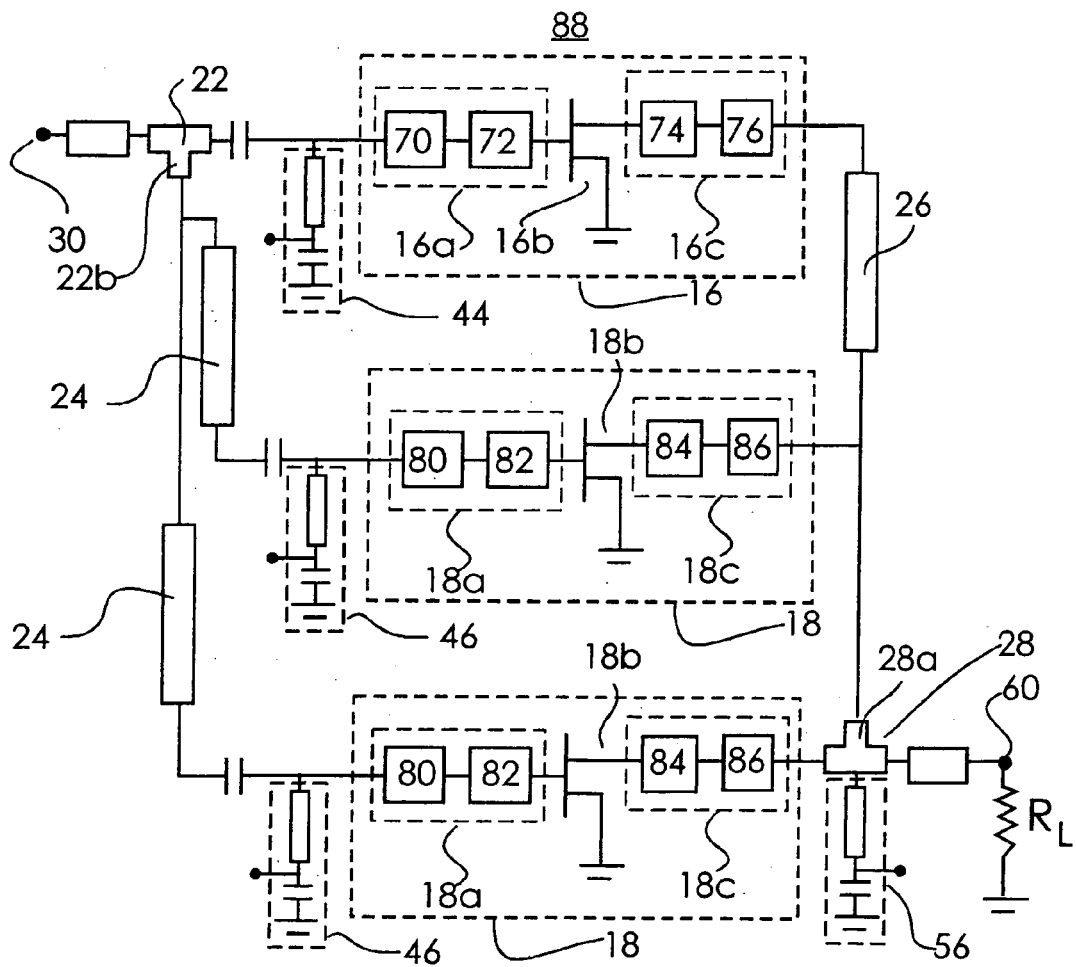
FIG. 12 is a circuit diagram showing a modification of the high-frequency power amplifier according to an embodiment of the present invention.

FIG. 12 is a circuit diagram showing a modification of the high-frequency power amplifier according to an embodiment of the present invention.

In a Doherty amplifier 88 shown in FIG. 12, the second branch of the divider circuit 22 is further split into two branches and the first branch of the combiner circuit is further split into two branches so as to connect another phase compensating circuit 24 and another peak amplifier 18 between the second branch of the divider circuit 22 and the first branch of the combiner circuit in parallel to a phase compensating circuit 24 and a peak amplifier 18 disposed between the second branch of the divider circuit 22 and the second branch of the combiner circuit in the Doherty amplifier 10 shown in FIGS. 1 and 2.

Thus, using a plurality of peak amplifiers 18 provides the same effect as that obtained by increasing the size of the second FET chip 18b of the peak amplifier 18, making it possible to improve the efficiency of the amplifier at a low output level.

Regarding the Doherty amplifier 10 explained in the first embodiment, the description has been given of the case where the carrier amplifier 16 includes the first input higher harmonic reflection circuit 72 and the first output higher harmonic reflection circuit 74, and the peak amplifier 18 includes the second input higher harmonic reflection circuit 82 and the second output higher harmonic reflection circuit 74. However, even if the first input higher harmonic reflection circuit 72 and the second input higher harmonic reflection circuit 82 are removed, the output efficiency of the amplifier can be improved in a low output level range with a sufficient offset backoff from a maximum output of the amplifier.

As described above, in the high-frequency power amplifier according to the first embodiment, the carrier amplifier of the Doherty amplifier is provided with an output higher harmonic reflection circuit that is connected to the output terminal of the first FET chip and sets an even higher harmonic load of an output signal at the output terminal to be short-circuited or at a low impedance approximate to a short circuit, and sets an odd higher harmonic load of an output signal at the output terminal to be open-circuited or at a high impedance approximate to open-circuit. Further, the peak amplifier is provided with an output higher harmonic reflection circuit that is connected to the output terminal of the second FET chip, and sets an even higher harmonic load of an output signal at the output terminal to be open-circuit or at a high impedance approximate to open-circuit, while setting an odd higher harmonic load of an output signal of the output terminal to be short-circuited or at a low impedance approximate to a short-circuit. This arrangement enables the peak amplifier to provide outputs that are greater than those of the carrier amplifier, permitting higher output efficiency of the amplifier to be achieved in a low output level range with a sufficient offset backoff from a maximum output of the amplifier. As a result, it is possible to provide a Doherty amplifier having a simple configuration that outputs signals of good quality with minimized distortion, the Doherty amplifier being used with microwave-band and millimeterwave-band communications equipment for mobile communication, satellite communication or the like.

Second Embodiment

Figure 13:
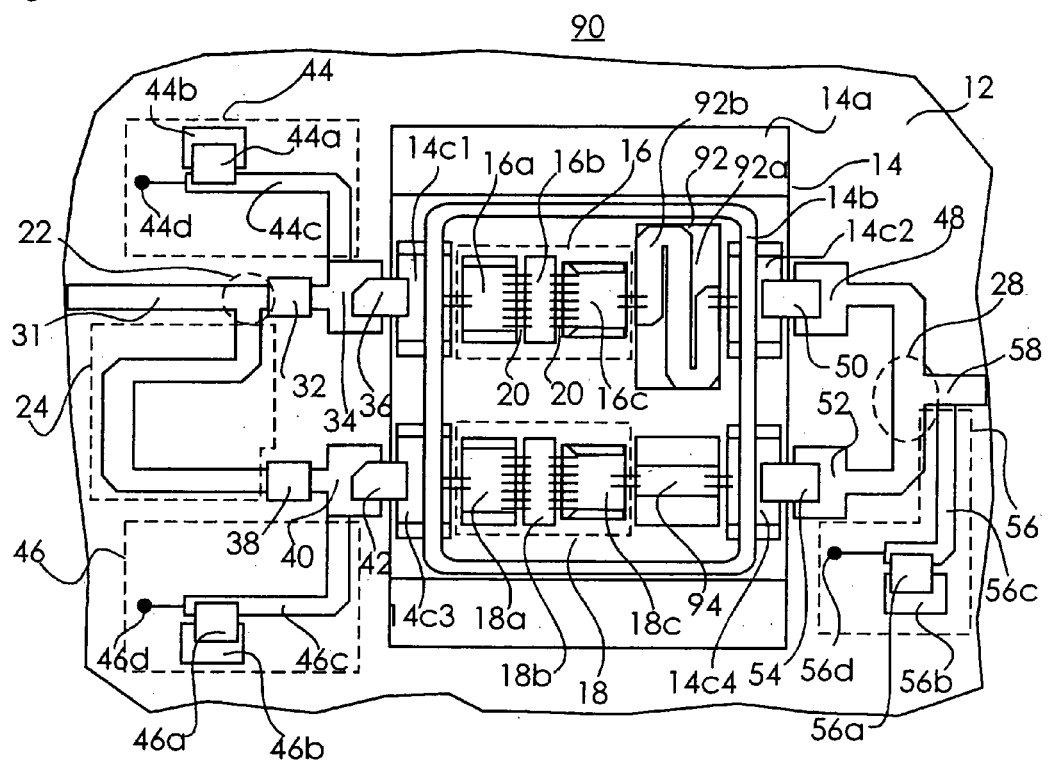
FIG. 13 is a plan view of a high-frequency power amplifier according to another embodiment of the present invention.
Figure 14:
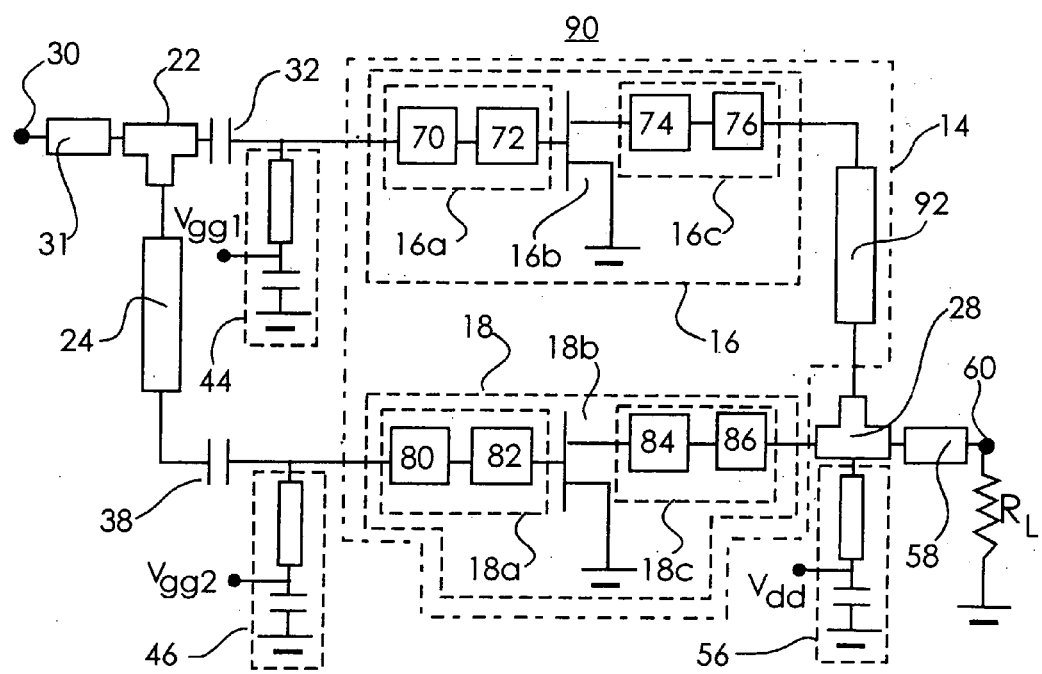
FIG. 14 is a circuit diagram of a high-frequency power amplifier according to the embodiment of the present invention.

FIG. 13 is a plan view of a high-frequency power amplifier according to another embodiment of the present invention. FIG. 14 is a circuit diagram of a high-frequency power amplifier according to the embodiment of the present invention.

FIGS. 13 and 14 show a Doherty amplifier 90, which is an example of the second embodiment.

The Doherty amplifier 90 shares the same basic construction as the Doherty amplifier 10 according to the first embodiment. The Doherty amplifier 90 differs from the Doherty amplifier 10 in that the Doherty network 26, which is disposed on the PTFE board 12 in the Doherty amplifier 10, has been replaced by a smaller Doherty network 92, which includes a dielectric board 92a formed of a dielectric having a higher specific inductive capacity than that of the PTFE board 12. The dielectric board 92a uses, for example, barium titanate (BaTiO$_3$) having a specific inductive capacity of approximately 38. A microstrip line 92b having an electrical length equivalent to a quarter wavelength of a signal frequency is formed on the dielectric board 92a to make the Doherty network 92, which has been reduced in size, while retaining the electrical length equivalent to a quarter wavelength of a signal frequency. The Doherty network 92 is disposed on a metal substrate 14a in the area surrounded by a wall 14b of a package 14.

The specific inductive capacity of the substrate material used for the Doherty network 92 ranges from about 8 to about 300. If the specific inductive capacity is excessively high, then the size of the Doherty network 92 may be too small, depending on signal frequencies. Preferably, therefore, materials having specific inductive capacities ranging from about 8 to about 50 are used. For example, TiO or alumina having a specific inductive capacity of about 9.8 may be used.

Since the Doherty network 92 is placed in the area enclosed by the wall 14b of the package 14, a microstrip line 94 is provided as a connection line adjacent to a peak amplifier 18.

The Doherty amplifier 90 has the same construction as the Doherty amplifier 10 according to the first embodiment except that the shape of a combiner circuit 28 is slightly different because the Doherty network 92 is sealed in the area enclosed by the wall 14b of the package 14.

In general, a Doherty network requires an electrical length equivalent to a quarter of the wavelength of a signal frequency, and as the wavelength increases as the frequency of a signal passing through the amplifier lowers. This results in an increased size of the entire amplifier.

An effective wavelength λL of a signal propagated through a microstrip line formed on a substrate having a specific inductive capacity ∈r is represented by the expression given below when the wavelength of a microwave in vacuum is denoted as λ0.

$$\lambda L = \lambda 0/(\in r)^{1/2} \quad (17)$$

Thus, in the Doherty amplifier 90, the microstrip line of a quarter wavelength of a signal frequency is formed on the dielectric board having a higher specific inductive capacity than that of the PTFE board 12 instead of forming a Doherty network that is formed using a microstrip line of a quarter wavelength of a signal frequency and mounted on the PTFE board 12 as a circuit board. This arrangement makes it possible to make the smaller Doherty network sealed in the area surrounded by the wall 14b of the package 14 thereby to provide the smaller Doherty amplifier.

As described above, the high-frequency power amplifier according to the second embodiment not only provides the advantages of the first embodiment, but also makes it possible to provide a compact Doherty amplifier by disposing a Doherty network in a package, the Doherty network being formed using a microstrip line of a quarter wavelength of a signal frequency and disposed on the board formed of a dielectric exhibiting a higher specific inductive capacity than that used for a circuit board.

Moreover, it is possible to provide a compact Doherty high-frequency power amplifier having a simple configuration that outputs signals of good quality with minimized distortion, the Doherty amplifier being used with microwave-band and millimeterwave-band communications equipment for mobile communication, satellite communication or the like.

Third Embodiment

Figure 15:
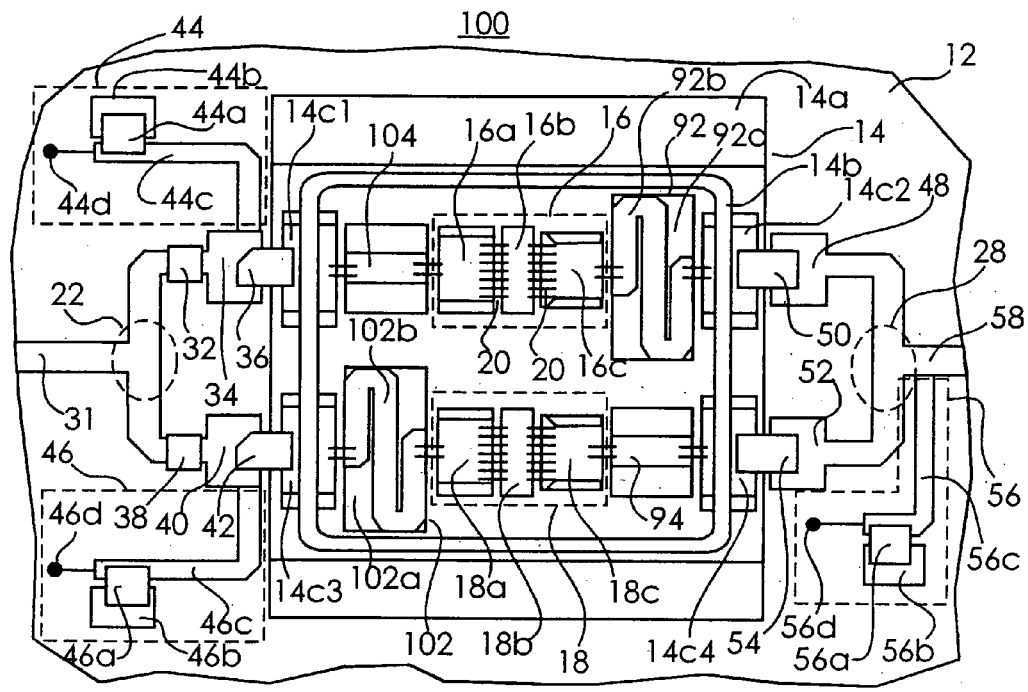
FIG. 15 is a plan view of a high-frequency power amplifier according to still another embodiment of the present invention.
Figure 16:
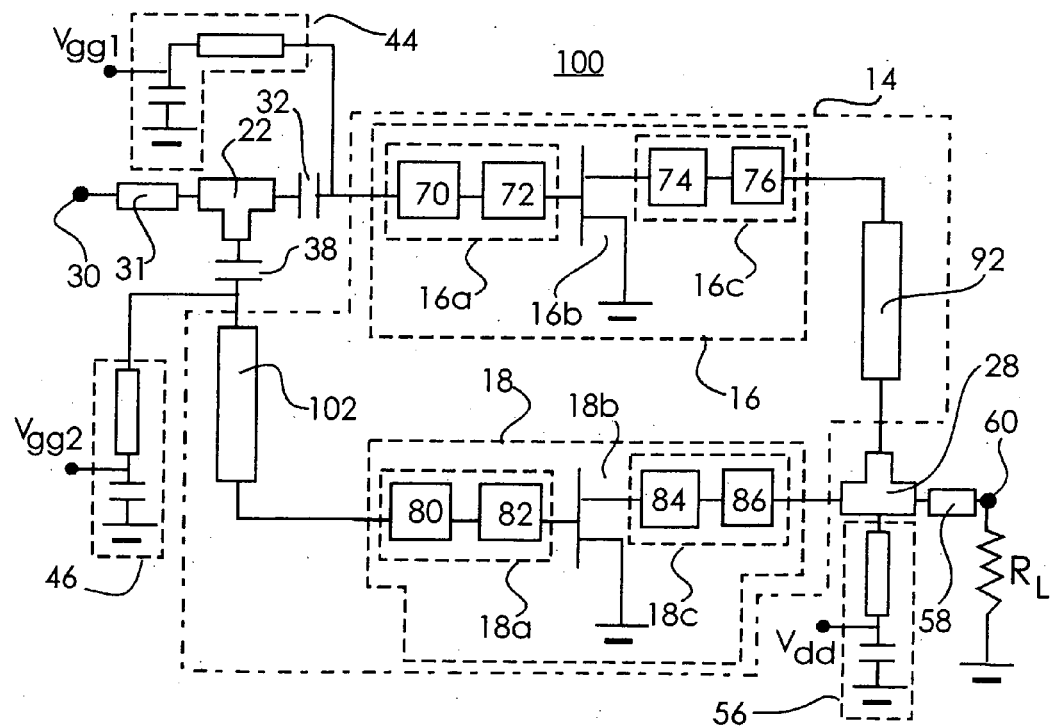
FIG. 16 is a circuit diagram of a high-frequency power amplifier according to the embodiment of the present invention.

FIG. 15 is a plan view of a high-frequency power amplifier according to still another embodiment of the present invention. FIG. 16 is a circuit diagram of a high-frequency power amplifier according to the embodiment of the present invention.

FIGS. 15 and 16 show a Doherty amplifier 100, which is an example of the third embodiment.

The Doherty amplifier 100 shares the same basic construction as the Doherty amplifier 10 according to the first embodiment and the Doherty amplifier 90 according to the second embodiment. The Doherty amplifier 100 differs from the Doherty amplifier 90 in an aspect described below. In the Doherty amplifier 90, a microstrip line 92b having an electrical length equivalent to a quarter wavelength of a signal frequency is formed on the dielectric board 92a to make the Doherty network 92, which has been reduced in size, while retaining the electrical length equivalent to a quarter wavelength of a signal frequency, and which is disposed on the metal substrate 14a in the area surrounded by the wall 14b of a package 14. In the Doherty amplifier 100, a microstrip line 92b having an electrical length equivalent to a quarter wavelength of a signal frequency is formed on a dielectric board 92a serving as a first dielectric board to make a Doherty network 92, which has been reduced in size, while retaining the electrical length equivalent to a quarter wavelength of a signal frequency, and a microstrip line 102b having an electrical length equivalent to a quarter wavelength of a signal frequency is formed on a dielectric board 102a serving as a second dielectric board made of a dielectric material having a specific inductive capacity ranging from about 8 to about 300 similar to that of the dielectric board 92a, preferably ranging from about 8 to about 50, in place of the phase compensating circuit 24 disposed on the PTFE board 12. Thus, a phase compensating circuit 102, which has been reduced in size while retaining an electrical length equivalent to a quarter wavelength of a signal frequency is formed and disposed on an internal metal substrate 14a enclosed by a wall 14b of a package 14.

More specifically, the Doherty network 92, which has been reduced in size and formed on the dielectric board having a higher specific inductive capacity than that of the PTFE board 12, and the phase compensating circuit 102 are sealedly disposed on an area of the metal substrate 14a enclosed by a wall 14b of a package 14. This permits a still smaller Doherty amplifier.

Since the phase compensating circuit 102 is placed in the area enclosed by the wall 14b of the package 14, a microstrip line 104 is disposed as a connection line adjacent to a peak amplifier 18.

The Doherty amplifier 100 has the same construction as the Doherty amplifier 90 according to the second embodiment except that the shape of a divider circuit 24 is slightly different because the phase compensating circuit 102 is sealed in the area enclosed by the wall 14b of the package 14.

Second Modification

Figure 17:
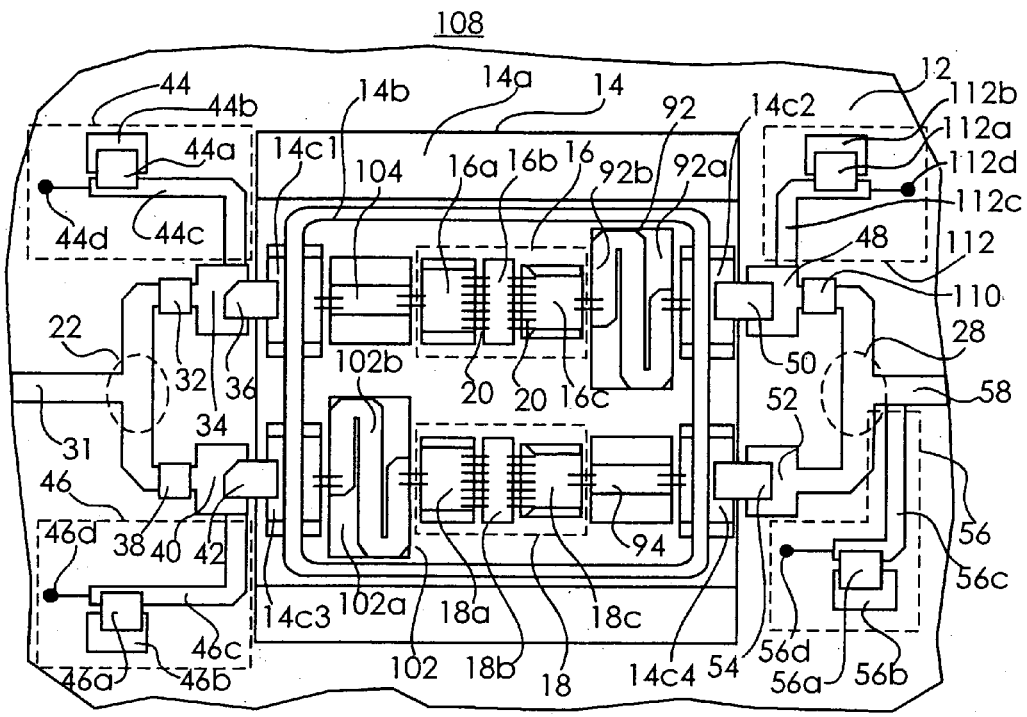
FIG. 17 is a plan view of a modification of a high-frequency power amplifier according to an embodiment of the present invention.
Figure 18:
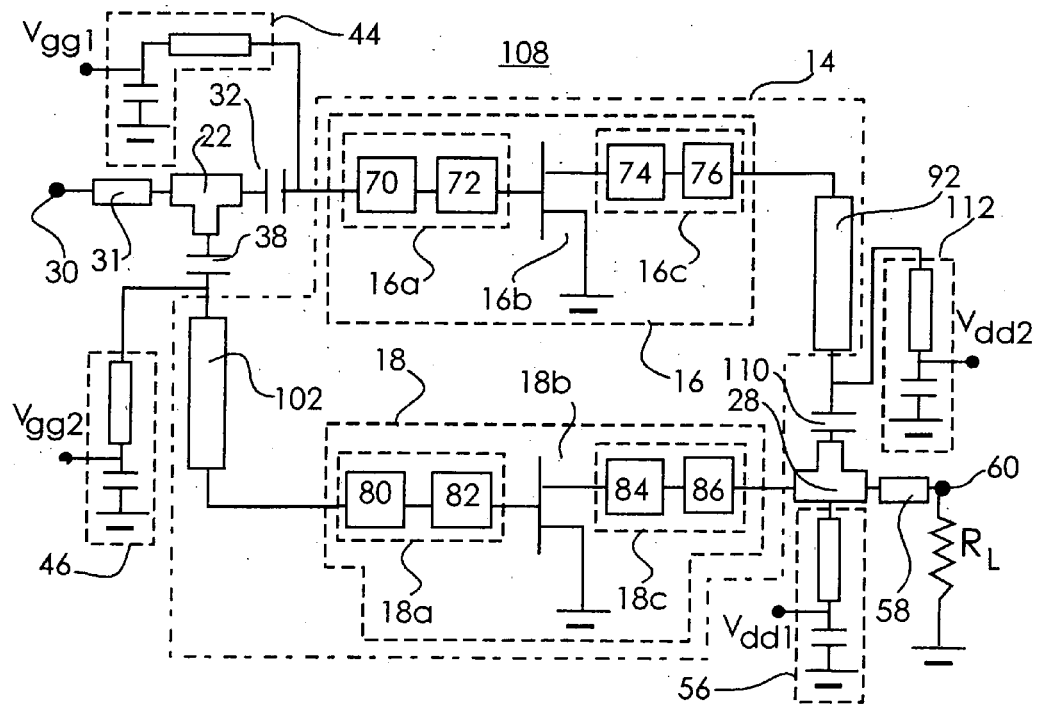
FIG. 18 is a circuit diagram of the modification of the high-frequency power amplifier according to the embodiment of the present invention.

FIG. 17 is a plan view of a modification of a high-frequency power amplifier according to an embodiment of the present invention. FIG. 18 is a circuit diagram of the modification of the high-frequency power amplifier according to the embodiment of the present invention.

A Doherty amplifier 108 shown in FIGS. 17 and 18 shares the same basic construction as that of the Doherty amplifier 100. In the Doherty amplifier 100, a drain bias circuit 56 supplies a drain bias voltage Vdd to the drain of a first FET chip 16b and the drain of a second FET chip 18b, respectively. Meanwhile, in the Doherty amplifier 108, a first branch of a combiner circuit 28 is connected to a connection land 48 through the intermediary of a chip capacitor 110 having a DC-cut function. A drain bias circuit 112 is connected to the connection land 48, a drain bias voltage Vdd2 being applied to the drain of the first FET chip 16b through the intermediary of a first output matching circuit 16c.

The drain bias circuit 112 is constructed of a line 112c, one end of the line 112c is connected to an earth end 112b through the intermediary of a chip capacitor 112a, and the other end of the line 112c is connected to the connection land 48. The drain bias voltage Vdd2 is applied to a signal input terminal 112d connected to the line 112c.

The Doherty amplifier 108 having the construction described above allows the drain bias voltage Vdd2 to be applied to the drain of the first FET chip 16b of the carrier amplifier 16 by the drain bias circuit 112, and also allows a drain bias voltage Vdd1 to be applied to the drain of the second FET chip 18b of a peak amplifier 18 by a drain bias circuit 56. Thus, outputs of the peak amplifier 18 can be made larger than outputs of the carrier amplifier 16 by setting the drain voltage applied to the second FET chip 18b of the peak amplifier 18 to be higher than the drain voltage of the first FET chip 16b of the carrier amplifier 16. This allows the efficiency of the amplifier at a low output level to be enhanced.

The second modification has been explained by comparing it with the Doherty amplifier 100. However, separately applying the drain bias voltages to the drain of the first FET chip 16b of the carrier amplifier 16 and the drain of the second FET chip 18b of the peak amplifier 18, respectively can be applied also to the first embodiment and the second embodiment. This makes it possible to set the outputs of the peak amplifier 18 to be larger than the outputs of the carrier amplifier 16, so that the efficiency of the amplifier at a low output level can be further enhanced in addition to the advantages of each of the first embodiment and the second embodiment.

Third Modification

Figure 19:
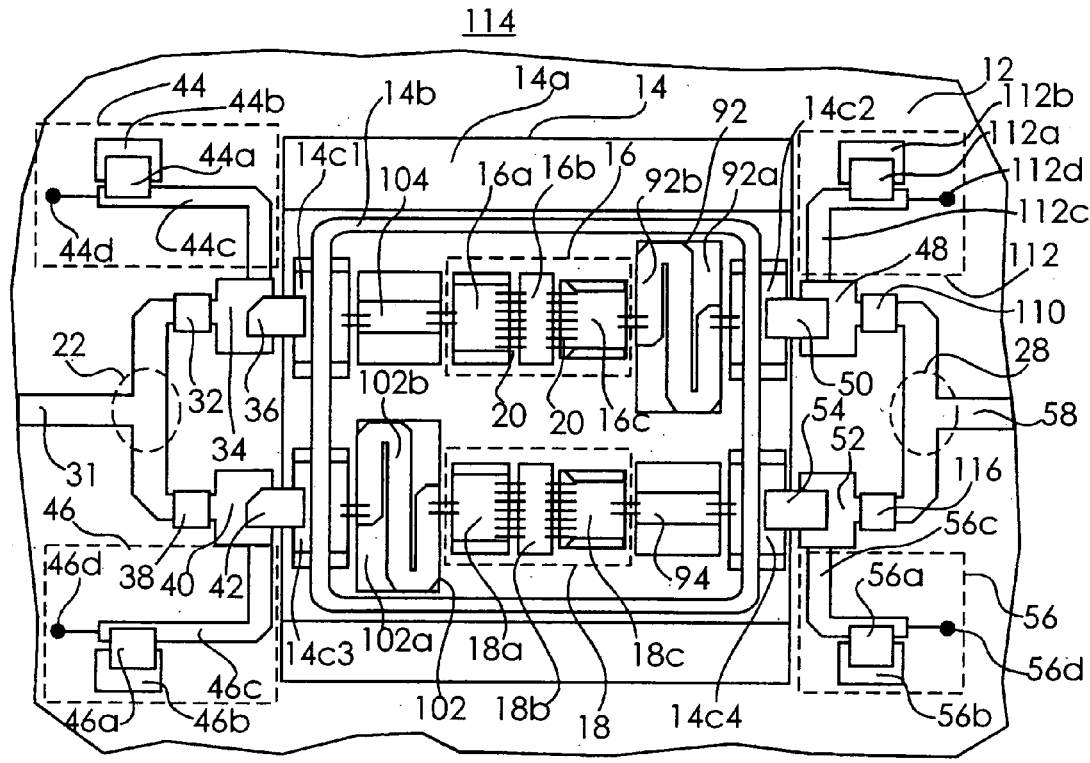
FIG. 19 is a plan view of a third modification of a high-frequency power amplifier according to an embodiment of the present invention.
Figure 20:
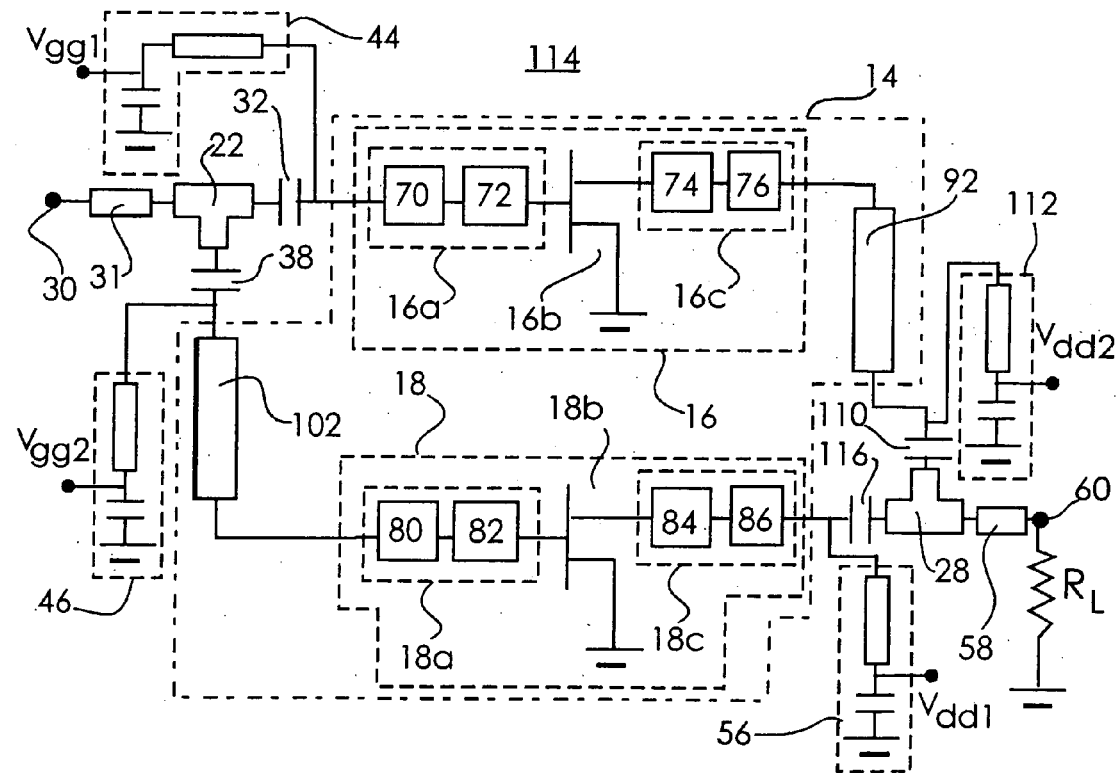
FIG. 20 is a circuit diagram of the modification of the high-frequency power amplifier according to the embodiment of the present invention.

FIG. 19 is a plan view of a third modification of a high-frequency power amplifier according to an embodiment of the present invention. FIG. 20 is a circuit diagram of the modification of the high-frequency power amplifier according to the embodiment of the present invention.

A Doherty amplifier 114 shown in FIGS. 19 and 20 share the same basic construction as the Doherty amplifier 108. In the Doherty amplifier 108, the drain bias circuit 56 is connected to the second branch of the combiner circuit 28 to apply the drain bias voltage only to the drain of the second FET chip 18b of the peak amplifier 18. In the Doherty amplifier 114, a second branch of a combiner circuit 28 is connected to a connection land 52 through the intermediary of a chip capacitor 116, and a drain bias circuit 56 is also connected to the connection land 52. This configuration provides an advantage similar to that of the second modification. According to the configuration, a carrier amplifier 16, a peak amplifier 18, a Doherty network 92, and a phase compensating circuit 102 are disposed in an area enclosed by a wall 14b of a package 14. Alternatively, the drain bias circuit 56, a drain bias circuit 112, and chip capacitors 110 and 116 may be disposed in the area enclosed by the wall 14b of the package 14 so as to reduce the size of the entire amplifier.

Fourth Modification

Figure 21:
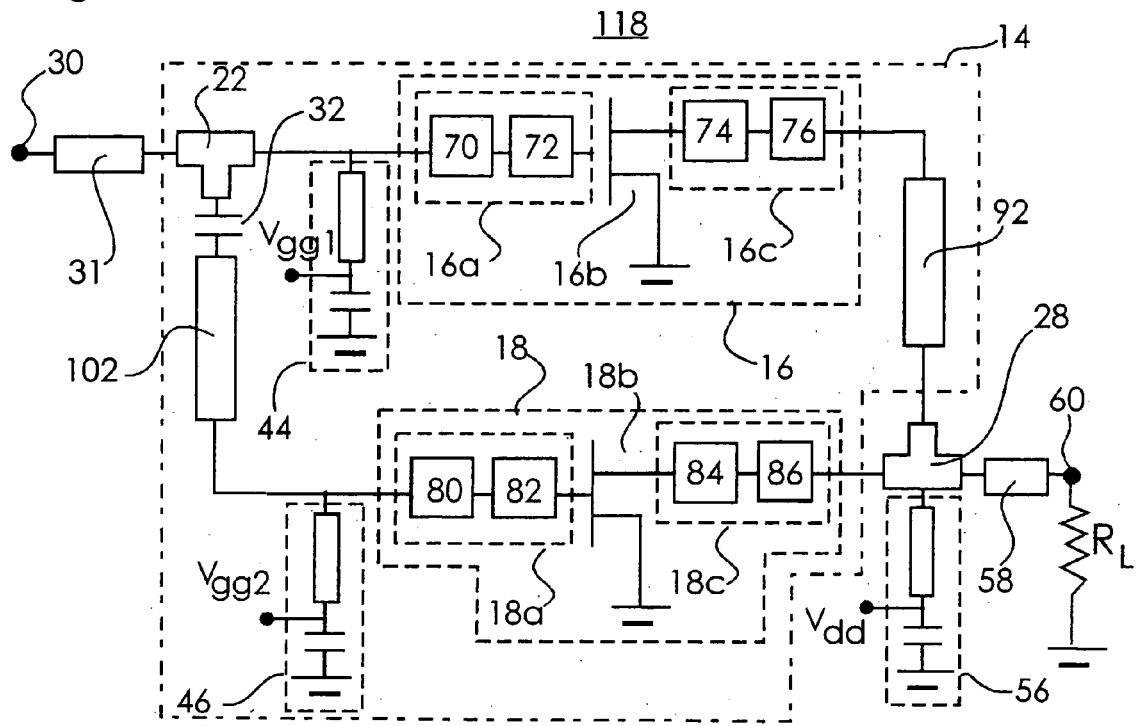
FIG. 21 is a circuit diagram of a fourth modification of a high-frequency power amplifier according to an embodiment of the present invention.

FIG. 21 is a circuit diagram of a fourth modification of a high-frequency power amplifier according to an embodiment of the present invention.

In a Doherty amplifier 118 shown in FIG. 21, a divider circuit 22, a phase compensating circuit 102, a first gate bias circuit 44 of a carrier amplifier 16, and a second gate bias circuit 46 of a peak amplifier 18 are also disposed on an internal metal substrate 14a enclosed by a wall 14b of a package 14 in addition to the components enclosed by the wall 14b of the package 14 of the Doherty amplifier 90 shown in FIGS. 13 and 14. This arrangement makes it possible to further reduce the size of the Doherty amplifier.

Fifth Modification

Figure 22:
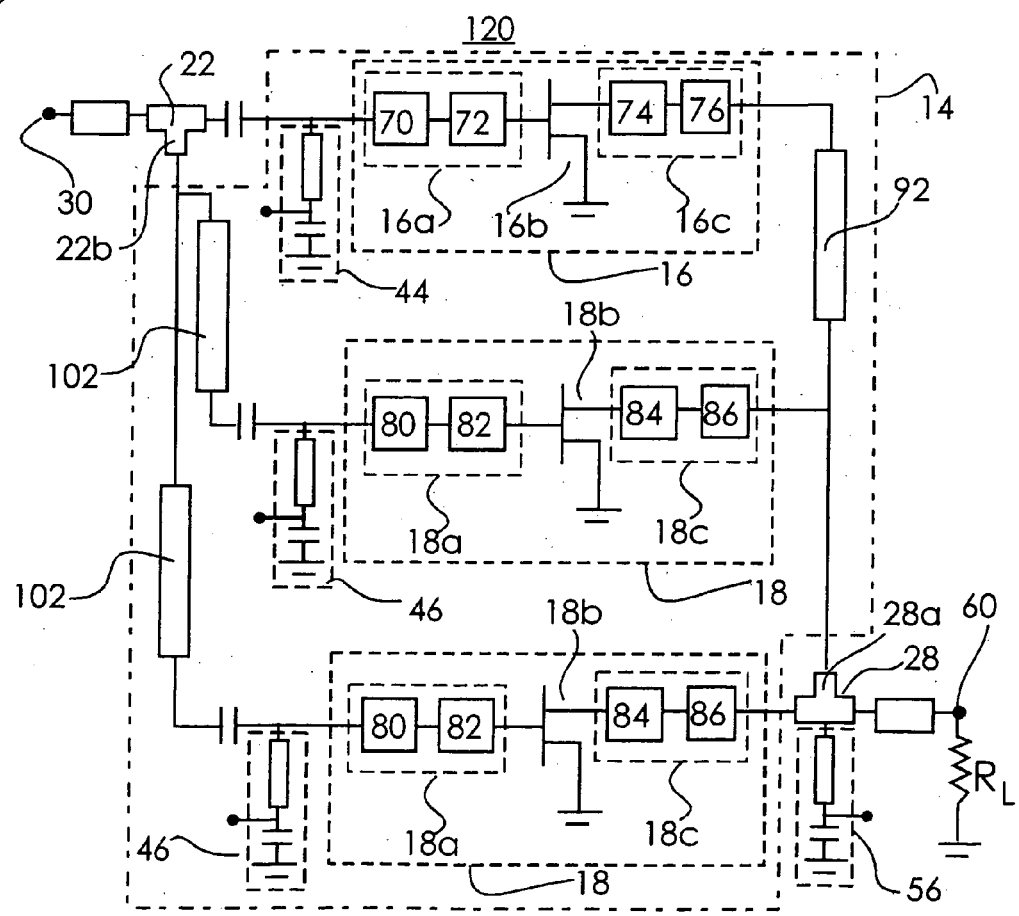
FIG. 22 is a circuit diagram of a fifth modification of a high-frequency power amplifier according to an embodiment of the present invention.

FIG. 22 is a circuit diagram of a fifth modification of a high-frequency power amplifier according to an embodiment of the present invention.

In a Doherty amplifier 120 shown in FIG. 22, the first modification of the first embodiment is all disposed in an area on a metal substrate 14a that is surrounded by a wall 14b of a package 14.

More specifically, a carrier amplifier 16, a first gate bias circuit 44, and two pairs of a combination of a phase compensating circuit 102, a peak amplifier 18, and a second gate bias circuit 46 are disposed on an area of the metal substrate 14a surrounded by the wall 14b of the package 14. This arrangement allows the Doherty amplifier to be made smaller.

As described above, the high-frequency power amplifier according to the third embodiment provides the advantage of the first embodiment discussed above and also makes it possible to provide a smaller Doherty amplifier by including, in the package, the Doherty network formed using the microstrip line having an electrical length equivalent to a quarter wavelength of a signal frequency on the dielectric board having a higher inductive capacity than that of the circuit board, and the phase compensating circuit formed using the microstrip line having an electrical length equivalent to a quarter wavelength of a signal frequency on the dielectric board having a higher inductive capacity than that of the circuit board. This makes it possible to provide a compact Doherty high-frequency power amplifier having a simple configuration that outputs signals of good quality with minimized distortion, the Doherty amplifier being used with microwave-band and millimeterwave-band communications equipment for mobile communication, satellite communication or the like.

In the second and the third embodiments, the descriptions have been given of the case where the class F carrier amplifiers and the class inverse-F peak amplifiers are used. The present invention, however, is not limited to such cases.

In each embodiment, FETs used as the transistors for the amplifier circuits include standard field-effect transistors, such as MESFETs and HEMTs. The same advantages can be accomplished by using standard bipolar transistors or HBTs. If a bipolar transistor is used, its base terminal serves as a control terminal, its emitter terminal serves as a constant-potential terminal, and its collector terminal serves as an output terminal.

In each of the Doherty amplifiers according to the aforesaid embodiments discussed above, the carrier amplifier includes the input higher harmonic reflection circuit and the output higher harmonic reflection circuit, and the peak amplifier includes the input higher harmonic reflection circuit and the output higher harmonic reflection circuit. However, a construction without the input higher harmonic reflection circuit and the output higher harmonic reflection circuit will advantageously improve the output efficiency of an amplifier in a low output level range in which a large offset backoff from a maximum output of the amplifier is provided.

Thus, the high-frequency power amplifiers according to the present invention can be ideally used with microwave-band and millimeterwave-band communications equipment for mobile communication, satellite communication or the like.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A power amplifier comprising:
   a divider circuit having an input end, a first branch, and a second branch for dividing an input signal received through the input end into a first input signal and a second input signal;
   a first amplifier circuit including
      a first transistor that has a first control terminal connected to the first branch of the divider circuit to receive the first input signal, a constant-potential terminal, and an output terminal through which a first output signal is issued, and
      a first output higher harmonic load control circuit connected to the output terminal of the first transistor, setting an even-numbered higher harmonic load of the first output signal at the output terminal of the first transistor to be a short-circuit, or a low impedance approximating a short-circuit, while setting an odd-numbered higher harmonic load of the output signal at the first output terminal to be an open-circuit, or at a high impedance approximating an open-circuit;
   a first impedance conversion circuit having an input end thereof connected to an output end of the first output higher harmonic load control circuit of the first amplifier circuit, and having an electrical length equivalent to one-quarter of the wavelength of an output signal from the first output higher harmonic load control circuit;
   a second impedance conversion circuit having an input end thereof connected to the second branch, and imparting a phase difference, which offsets a phase difference to be imparted by the first impedance conversion circuit, to the second input signal from the second branch;
   a second amplifier circuit including
      a second transistor that has a control terminal connected to an output end of the second impedance conversion circuit, a constant-potential terminal, and an output terminal through which a second output signal is issued, and
      a second output higher harmonic load control circuit connected to the output terminal of the second transistor, setting an even-numbered higher harmonic load of the second output signal at the output terminal of the second transistor to be an open-circuit, or a high impedance approximating an open-circuit, while setting an odd-numbered higher harmonic load of the second output signal at the output terminal of the second transistor to be a short-circuit, or at a low impedance approximating a short-circuit; and
   a combiner circuit having a third branch, a fourth branch, and an output end through which a third output signal is issued, the third branch being connected to an output end of the first impedance conversion circuit, and the fourth branch being connected to an output end of the second output higher harmonic load control circuit.

2. The power amplifier according to claim 1, further comprising:
   a first input higher harmonic load control circuit connected between the first branch of the divider circuit and the control terminal of the first transistor, and setting an even-numbered higher harmonic load of an input signal of the control terminal of the first transistor to be a short-circuit, or at a low impedance approximating a short-circuit; and
   a second input higher harmonic load control circuit connected between the output end of the second impedance conversion circuit and the control terminal of the second transistor, and setting an even-numbered higher harmonic load of an input signal of the control terminal of the second transistor to be an open-circuit, or at a high impedance approximating an open-circuit.

3. A power amplifier comprising:

a dielectric circuit board;

a divider circuit disposed on the circuit board, having an input end, a first branch, and a second branch for dividing input signals received through the input end into a first input signal and a second input signal;

a package disposed on the circuit board, having a metal substrate and a wall which is disposed on the metal substrate, and which surrounds a region of the metal substrate, a plurality of connecting terminals which connect an internal region surrounded by the wall and an external region, and a covering member which seals an area inside the wall;

a first amplifier circuit disposed on the region of the metal substrate surrounded by the wall of the package, including a first transistor that has a control terminal connected to the first branch of the divider circuit through a first of the plural connecting terminals for receiving the first input signal, a constant-potential terminal, and an output terminal through which a first output signal is issued, and a first output higher harmonic load control circuit that is connected to the output terminal of the first transistor, setting an even-numbered higher harmonic load of a first output signal at the output terminal of the first transistor to be a short-circuit, or at a low impedance approximating a short-circuit, while setting an odd-numbered higher harmonic load of the first output signal at the output terminal of the first transistor to be an open-circuit, or at a high impedance approximating an open-circuit;

a first impedance conversion circuit disposed on the circuit board, having one end thereof connected to an output end of the first output higher harmonic load control circuit through a second of the plural connecting terminals, and having an electrical length equivalent to one-quarter of the wavelength of an output signal from the first output higher harmonic load control circuit;

a second impedance conversion circuit disposed on the circuit board, having one end thereof connected to the second branch, and imparting a phase difference, which offsets a phase difference to be imparted by the first impedance conversion circuit, to a second input signal from the second branch;

a second amplifier circuit disposed on the region of the metal substrate surrounded by the wall of the package, including a second transistor that has a control terminal connected to an output end of the second impedance conversion circuit through a third of the plural connecting terminals, a constant-potential terminal, and an output terminal through which a second output signal is issued, and a second output higher harmonic load control circuit connected to the output terminal of the second transistor, setting an even-numbered higher harmonic load of the second output signal at the output terminal of the second transistor to be an open-circuit, or at a high impedance approximating an open-circuit, while setting an odd-numbered higher harmonic load of the second output signal at the output terminal of the second transistor to be a short-circuit, or a low impedance approximating a short-circuit; and a combiner circuit disposed on the circuit board, having a third branch, a fourth branch, and an output end through which a third output signal is issued, the third branch being connected to an output end of the first impedance conversion circuit, and the fourth being branch connected to an output end of the second output higher harmonic load control circuit through a fourth of the plural connecting terminals, a third output signal being issued through the output end of the combiner circuit.

4. A power amplifier comprising:

a circuit board;

a divider circuit disposed on the circuit board, having an input end, a first branch, and a second branch for dividing input signals received through the input end into a first input signal and a second input signal;

a package disposed on the circuit board, having a metal substrate and a wall which is disposed on the metal substrate, and which surrounds a region of the metal substrate, a plurality of connecting terminals which connect an internal region surrounded by the wall and an external region, and a covering member which seals an area inside the wall;

a first amplifier circuit disposed on the region of the metal substrate surrounded by the wall of the package, including a first transistor that has a control terminal connected to the first branch of the divider circuit through a first of the plural connecting terminals for receiving the first input signal, a constant-potential terminal, and an output terminal through which a first output signal is issued, and a first output higher harmonic load control circuit that is connected to the output terminal of the first transistor, setting a higher harmonic load of the first output signal at the output terminal of the first transistor to a predetermined value;

a first impedance conversion circuit including a dielectric board having a specific inductive capacity that is larger than that of the circuit board, and a line disposed on the dielectric board, having an electrical length equivalent to one-quarter of the wavelength of an output signal propagated through the first output higher harmonic load control circuit, the first impedance conversion circuit being disposed on the region of the metal substrate surrounded by the wall of the package via the dielectric board, and one end of the first impedance conversion circuit being connected to an output end of the first output higher harmonic load control circuit;

a second impedance conversion circuit disposed on the circuit board, having one end thereof connected to the second branch, and imparting a phase difference, which offsets a phase difference to be imparted by the first impedance conversion circuit, to the second input signal from the second branch;

a second amplifier circuit disposed on the region of the metal substrate surrounded by the wall of the package, including a second transistor that has a control terminal connected to an output end of the second impedance conversion circuit through a second of the plural connecting terminals, a constant-potential terminal, and an output terminal through which a second output signal is issued, and a second output higher harmonic load control circuit connected to the output terminal of the transistor, setting a higher harmonic load of the second output signal at the output terminal of the second transistor to a predetermined value; and a combiner circuit disposed on the circuit board and having a third branch, a fourth branch, and an output end through which a third output signal is issued, the third branch being connected to an output end of the first impedance conversion circuit through a third of the plural connecting terminals, and the fourth branch being connected to an output end of the second output higher harmonic load control circuit through a fourth of the plural connecting terminals.

5. The power amplifier according to claim 4, wherein an even-numbered higher harmonic load of the first output signal at the output terminal of the first transistor is set to a short-circuit, or at a low impedance approximating a short-circuit, while an odd-numbered higher harmonic load of the first output signal at the output terminal of the first transistor is set to be an open-circuit, or at a high impedance approximating an open-circuit, and an even-numbered higher harmonic load of the second output signal at the output terminal of the second transistor is set to an open-circuit, or at a high impedance approximating an open-circuit, while an odd-numbered higher harmonic load of the second output signal at the output terminal of the second transistor is set to be a short-circuit, or at a low impedance approximating a short-circuit.

6. The power amplifier according to claim 3, further comprising:

a first input higher harmonic load control circuit disposed on the region of the metal substrate surrounded by the wall of the package, and connected between the first branch of the branch circuit and the control terminal of the first transistor, setting an even-numbered higher harmonic load of the first input signal at the control terminal of the first transistor to be a short-circuit or at a low impedance approximating a short-circuit; and a second input higher harmonic load control circuit connected between the output end of the second impedance conversion circuit and the control terminal of the second transistor, setting an even-numbered higher harmonic load of the second input signal at the control terminal of the second transistor to be an open-circuit, or at a high impedance approximating an open-circuit.

7. The power amplifier according to claim 1, wherein the first impedance conversion circuit has a characteristic impedance of $Z_d=(T \times R_o)/\alpha$, where a ratio of a fundamental wave voltage $V1$ of the signal at the input end of the first impedance conversion circuit to a fundamental wave voltage $V2$ of the signal at the output end of the first impedance conversion circuit is T, fundamental wave power at the output end of the combiner circuit at maximum output is 1, fundamental wave current of the signal at the output end of the first impedance conversion circuit is $\alpha$, and output load at the output end of the combiner circuit is $R_o$.

* * * * *